United States Patent [19]
Xie et al.

[11] Patent Number: 5,513,070
[45] Date of Patent: Apr. 30, 1996

[54] DISSIPATION OF HEAT THROUGH KEYBOARD USING A HEAT PIPE

[75] Inventors: Hong Xie; Mostafa Aghazadeh; Gregory Turturro; Chia-Pin Chiu, all of Chandler, Ariz.

[73] Assignee: Intel Corporation, Santa Clara, Calif.

[21] Appl. No.: 357,449

[22] Filed: Dec. 16, 1994

[51] Int. Cl.⁶ .................................................. H05K 7/20
[52] U.S. Cl. ...................... 361/700; 165/80.2; 165/80.5; 165/185; 174/15.2; 361/687; 361/704; 361/720
[58] Field of Search ............................... 165/80.3–80.5, 165/185, 104.26, 104.33; 174/15.2, 16.3; 361/687–689, 698–702, 704, 707, 719–721

[56] References Cited

U.S. PATENT DOCUMENTS

| | | |
|---|---|---|
| 3,741,292 | 6/1973 | Aakalu et al. . |
| 3,807,493 | 4/1974 | Stewart . |
| 3,817,321 | 6/1974 | von Cube et al. . |
| 3,829,740 | 8/1974 | Beasley . |
| 3,942,586 | 3/1976 | Fries . |
| 4,019,098 | 4/1977 | McCready et al. . |
| 4,104,700 | 8/1978 | Hutchison et al. . |
| 4,118,756 | 10/1978 | Nelson et al. . |
| 4,138,692 | 2/1979 | Meeker et al. . |
| 4,203,129 | 5/1980 | Oktay et al. . |
| 4,204,246 | 5/1980 | Arii et al. . |
| 4,322,737 | 3/1982 | Sliwa, Jr. . |
| 4,327,399 | 4/1982 | Sasaki et al. . |
| 4,330,812 | 5/1982 | Token . |
| 4,366,526 | 12/1982 | Lijoi et al. . |
| 4,449,576 | 5/1984 | Baum et al. . |
| 4,503,483 | 3/1985 | Basiulis . |
| 4,558,395 | 12/1985 | Yamada et al. . |
| 4,561,040 | 12/1985 | Eastman et al. . |
| 4,565,243 | 1/1986 | Ernst et al. . |
| 4,588,023 | 5/1986 | Munekawa . |
| 4,600,050 | 7/1986 | Noren . |
| 4,603,345 | 7/1986 | Lee et al. . |
| 4,633,371 | 12/1986 | Nagy et al. . |
| 4,644,385 | 2/1987 | Nakanishi et al. . |
| 4,768,581 | 9/1988 | Gotwald et al. . |
| 4,793,405 | 12/1988 | Diggelmann et al. . |
| 4,830,100 | 5/1989 | Kato et al. . |
| 4,909,315 | 3/1990 | Nelson et al. . |
| 4,933,747 | 6/1990 | Schroeder . |
| 4,951,740 | 8/1990 | Peterson et al. . |
| 4,958,257 | 9/1990 | Wenke . |
| 4,995,451 | 2/1991 | Hamburgen . |
| 5,001,548 | 3/1991 | Iversen . |
| 5,063,475 | 11/1991 | Balan . |
| 5,095,404 | 3/1992 | Chao ........................................ 361/700 |
| 5,113,315 | 5/1992 | Capp et al. ............................. 361/704 |
| 5,331,510 | 7/1994 | Ouchi et al. ........................... 174/15.2 |
| 5,339,214 | 8/1994 | Nelson . |
| 5,353,192 | 10/1994 | Nordin ................................... 361/700 |
| 5,383,340 | 1/1995 | Larson et al. ......................... 361/387 |
| 5,402,311 | 3/1995 | Nakajima ............................... 361/687 |

OTHER PUBLICATIONS

Advances in Thermal Modeling of Electronic Components and Systems, vol. 3, Avram Bar–Cohen and Allan D. Kraus, pp. 336–368, no known date.

Electronic Engineering Times, Oct. 10, 1994, "Two aim to cool Pentium–based notebooks", pp. 70 & 72.

*Primary Examiner*—Gregory D. Thompson
*Attorney, Agent, or Firm*—Blakely, Sokoloff, Taylor & Zafman

[57] ABSTRACT

An improved heat dissipation device particularly suited for removing heat from a surface mounted integrated circuit component coupled to a printed circuit board in a portable computer. Vias, which are at least partially filled with a heat conductive material, improve heat transfer between a component and a heat conductive block mounted on opposite surfaces of the circuit board. A first section near one end of the heat pipe is attached to the heat conductive block in a channel formed receptive to the heat pipe. A second section of the heat pipe including the second end is attached to a metal plate which is affixed beneath the keyboard. Heat from the component flows through the vias to the block and is transferred by the heat pipe to the metal plate where it is dissipated.

19 Claims, 3 Drawing Sheets

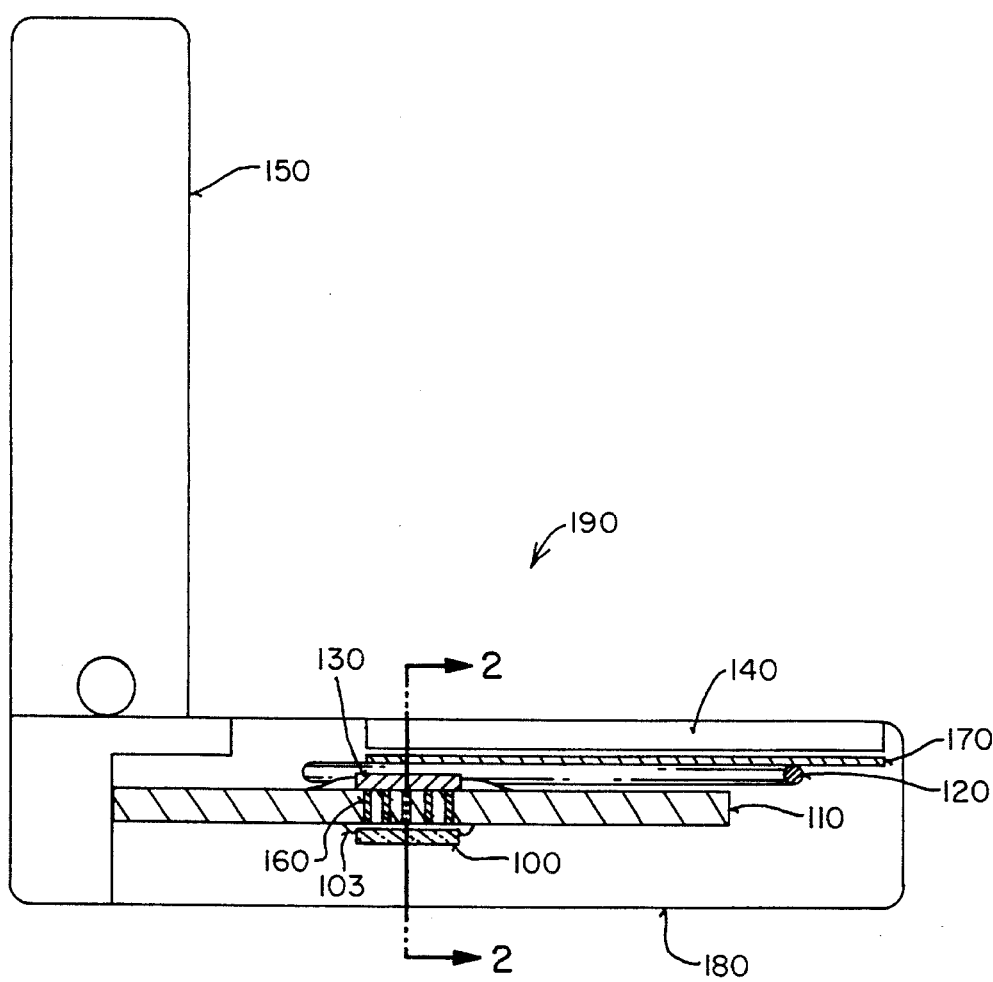
FIG_1
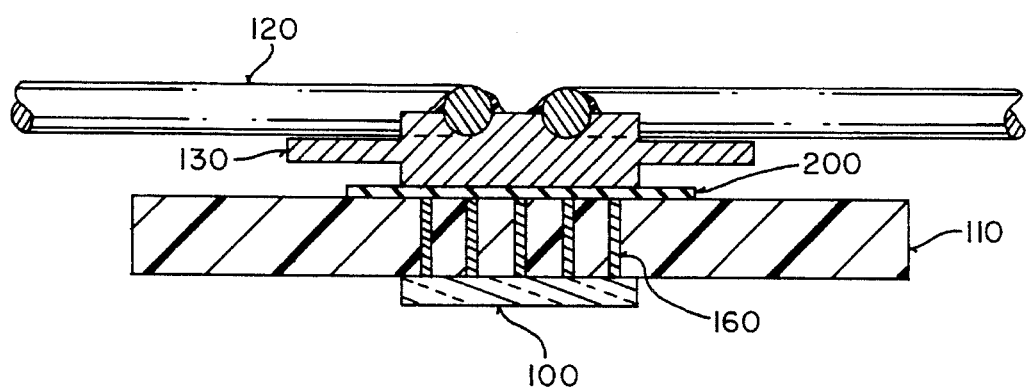
FIG_2

FIG_3
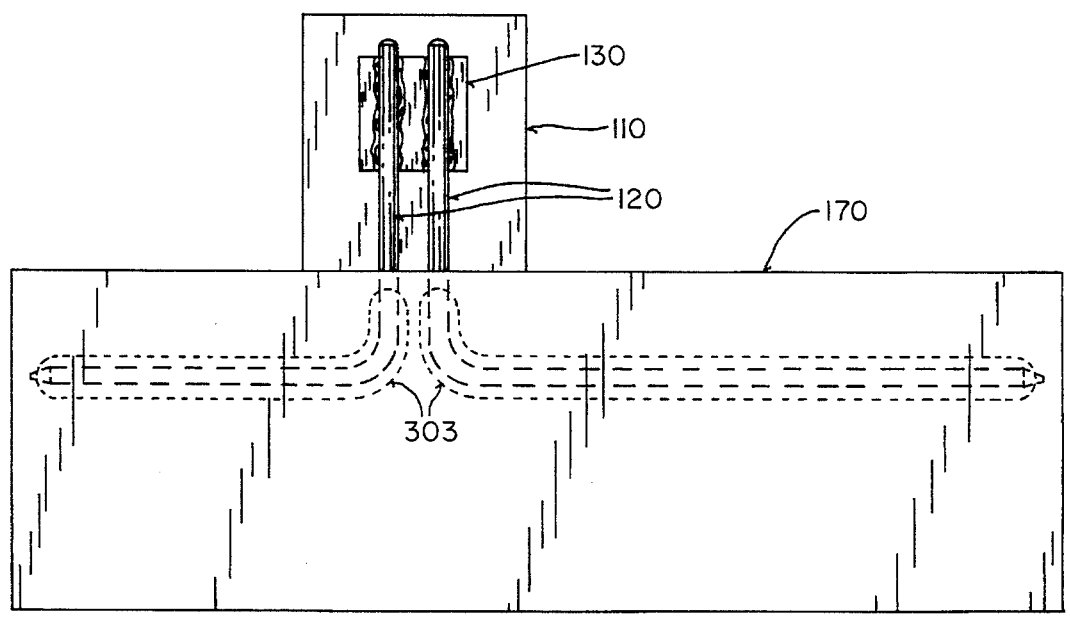
FIG_4A
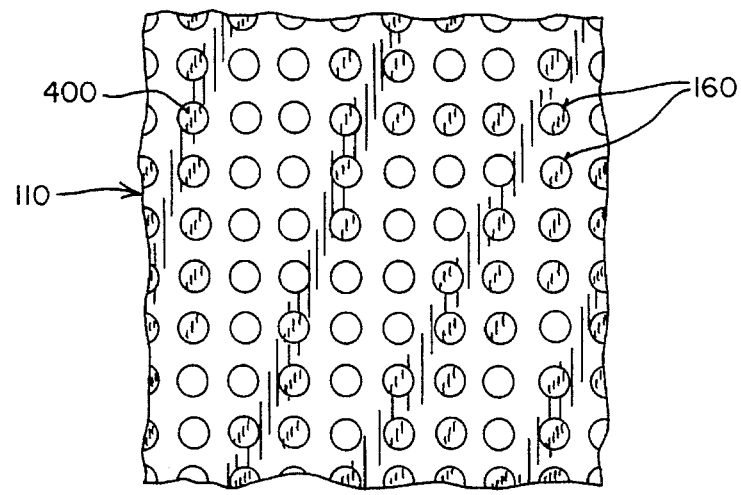
FIG_4B
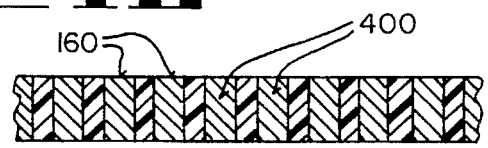

DISSIPATION OF HEAT THROUGH KEYBOARD USING A HEAT PIPE

FIELD OF THE INVENTION

The present invention pertains to the field of the removal of heat from electronic components. More particularly, this invention relates to the removal of heat from an integrated circuit mounted on a circuit board in a computer.

BACKGROUND OF THE INVENTION

Higher levels of integration and improved processing technology produce increasingly complex integrated circuits. New generations of integrated circuits often operate at higher frequencies and generate more heat than their predecessors. Typically, heat sinks, fans, and heat pipes have been employed to dissipate heat from various electronic components; thus, increases in heat generation have often been accommodated by increasing the quantity, size, and weight of these heat dissipation elements.

Portable computing devices have made smaller size, lighter weight, and less power consumption increasingly important factors in the design of computer components. These considerations work in opposition to the requirement for more heat dissipation. Specifically, heat sinks with greater heat dissipation capacity are generally larger, heavier, or require more air flow. Similarly, fans added to cool components occupy space, produce noise, and consume electrical power.

Further problems with traditional heat removal devices arise due to the use of small lightweight integrated circuit packages such as those used in surface mount technology. Heat removal devices which require a direct connection to the surface of the package are not always well suited for use with these increasingly fragile packages with smaller or non-uniform surfaces.

SUMMARY OF THE INVENTION

The present invention is an apparatus for removing heat from an electronic component mounted on a first surface of a circuit board. The apparatus includes at least one thermal via extending from the surface on which the electronic component is mounted to a second surface of the circuit board. A heat conducting mass on the second surface of the circuit board thermally engages the via(s). A heat pipe then transfers heat from the heat conducting mass to a heat dissipation plate which is affixed beneath a keyboard.

The invention utilizes an existing plate beneath the keyboard as a heat dissipation plate thus minimizing size and weight impact The invention achieves efficient heat transfer through a combination of heat transfer means forming an efficient thermal path from the electronic component to the heat dissipation plate. The invention uses no active electronic components and thus does not consume electrical power. Since the invention removes heat through the circuit board, a connection to the surface of the package other than the mounting surface is not required.

BRIEF DESCRIPTION OF THE FIGURES

The present invention is illustrated by way of example and not limitation in the figures of the accompanying drawings.

FIG. 1 is a cross sectional elevation view of a computer which incorporates the present invention.

FIG. 2 is a partial cross sectional elevation view of the computer of FIG. 1 taken through the section lines 2—2 of FIG. 1.

FIG. 3 is a partial plan view of the computer of FIG. 1,

FIG. 4a is a plan view of a portion of the circuit board used with the present invention.

FIG. 4b is a cross sectional elevation view of the portion of the circuit board shown in FIG. 4a.

DETAILED DESCRIPTION OF THE INVENTION

Figure 5:
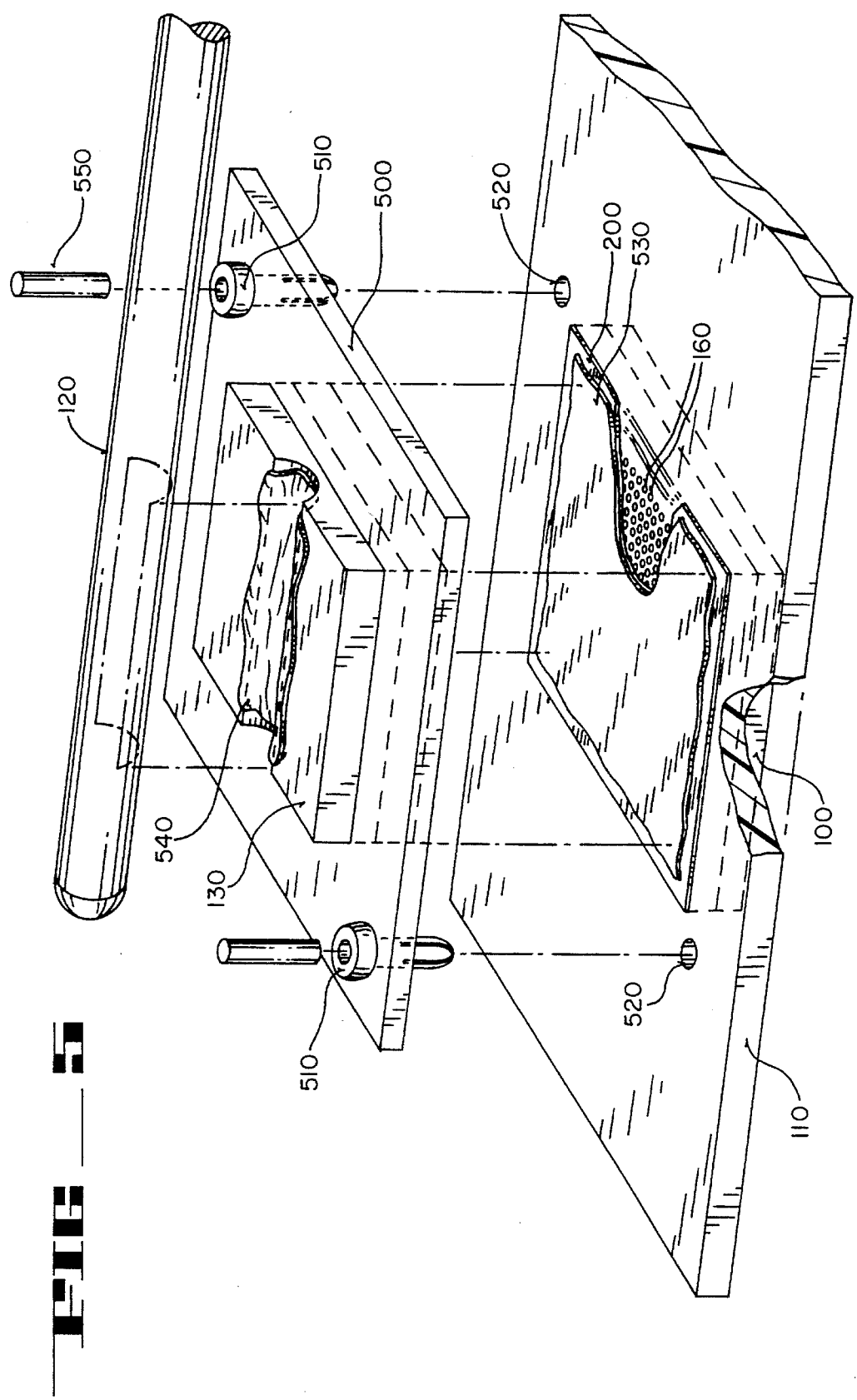
FIG. 5 is a detailed exploded assembly drawing showing elements attached to the circuit board.

An apparatus for heat dissipation is described. In the following description, numerous specific details are set forth, such as temperatures, heat pipe dimensions, via diameter, etc., in order to provide a thorough understanding of an embodiment of the present invention. It will be apparent to those skilled in the art that the present invention may be practiced without these specific details.

Referring to the drawings more particularly by reference numbers, FIG. 1 shows a computer 190 utilizing the present invention. This computer 190 is typically a notebook or laptop computer or any small portable computing device. It is to be understood that the present invention can be incorporated in other computers such as desktop computers.

As illustrated in FIG. 1, a typical computer includes a display device 150, a housing 180, and a keyboard 140. The computer also usually contains at least one circuit board 110. Many computers include a metal plate 170 which serves as an electromagnetic shield and is affixed beneath the keyboard 140. The present invention is not limited to any particular configuration of these elements.

Generally, an electronic component such as microprocessor 100 is mounted on a first surface of circuit board 110. The microprocessor die may be packaged in a compact lightweight tape carrier package (TCP). Modern, light weight integrated circuit packages do not afford as much protection to the integrated circuit die as did their predecessors. For example, a rigid ceramic package affords significant structural support and substantially isolates the integrated circuit die from external stress. In compact lightweight modern packages, the die or bond wires may be damaged by small external forces. Typically, the engaging surface of the circuit board is strong enough to avoid undue stress to the package; however pressure applied to the side of the package which does not engage the circuit board could cause damage. A microprocessor in a TCP or a component mounted using tape automated bonding (TAB) is especially suited for cooling by the present invention since it is desirable to avoid physical stress to such packages. The microprocessor 100 is soldered or otherwise electrically attached to the circuit board 110. Additionally, a die attach 103 comprising thermal epoxy or other means of improving heat flow may be applied between the microprocessor 100 and the circuit board 110.

In a computer utilizing the present invention, circuit board 110 includes a region with vias 160, improving heat flow through circuit board 110. A heat conducting mass such as aluminum block 130 is affixed to circuit board 110 and thermally engages the vias 160. Heat is transferred from the aluminum block 130 to the metal plate 170 by use of a heat pipe 120 such as those commonly used in heat transfer.

The present invention makes use of the often existing metal plate 170 as a heat sink or a heat dissipation plate.

Affixed beneath keyboard 140, the metal plate 170 is typically an aluminum plate which is included as an electromagnetic shield. Many portable computer designs already include such an electromagnetic shield to reduce emitted electromagnetic radiation from computer 190. Dissipation of heat using an existing metal plate 170 is highly advantageous in minimizing size and weight of computer 190. If a metal plate does not exist beneath the keyboard of a computer in which the present invention is to be used, one may be added.

The vias 160 of the present invention are further illustrated in FIGS. 4a and 4b. The vias 160 are apertures which may be drilled, punched, or otherwise formed in the circuit board 110, extending from the first surface of the circuit board 110 to a second surface. The apertures as currently preferred are of approximately the same dimension as other apertures used in other areas of the circuit board 110 for connecting device pins to traces on the circuit board 110, thus allowing them to be made without an additional manufacturing step. In one embodiment, the region of vias 160 is 0.6 inches by 0.6 inches and included 256 thermal vias each 20 mils in diameter; however, the size of the vias is not critical to the invention.

In a multiple layer circuit board, it may be desireable to route signals through the region which includes the vias 160. Such routing may be accommodated, but may require wider spacing between vias, special patterns of vias, or both.

It is preferred that the vias 160 contain a filler 400 of solder, however any material with higher thermal conductivity than circuit board 110 may be used. The use of either solder or copper is practical since both are normally used on circuit board 110 during manufacture. Consequently, the vias 160 can be filled without an additional manufacturing step. Generally, the vias 160 increase thermal conductivity even if no filler is used. It may not be practical to manufacture circuit board 110 such that all of the vias 160 are completely filled with filler 400. Even partially filled vias will have better thermal conductance than air filled vias or no vias at all. Additionally, applying a layer of solder to the region which includes the vias 160 on either or both surfaces of circuit board 110 will also improve the thermal conductivity through the circuit board 110. Applying a layer of solder to the via region is a practical method of at least partially filling the vias 160.

In one embodiment, the plated via region and at least partially filled vias 160 improved the thermal conductivity of the circuit board with the present invention from four degrees centigrade per watt to two and one half degrees centigrade per watt, or approximately sixty-two percent. Other arrangements with fewer vias were found to be effective, and it will be appreciated by one skilled in the art that other arrangements of thermal vias may result a similar improvement in thermal conductivity.

As illustrated in FIG. 2, the present invention may use an elastomer spacer 200 which is inserted between aluminum block 130 and the top surface of circuit board 110. Any suitable compressively conforming spacer may be used. The elastomer spacer 200 is thermally conductive and allows intimate physical contact between the various heat transfer components because it conforms to any surface irregularities. In the absence of the elastomer spacer 200, a thermal epoxy may still provide sufficient thermal coupling between the aluminum block 130 and the vias 160.

The present invention further includes a heat conductive mass such as aluminum block 130 which is coupled to the second surface of the circuit board 110 and thermally engages vias 160. The particular shape of the heat conductive mass is not critical as long the vias 160 are adequately thermally engaged. Instead of aluminum, a carbon based substance, copper, or other thermally conductive material may be used. Aluminum block 130 generally is formed such that each heat pipe 120 may be recessed into aluminum block 130 allowing a larger surface area of contact which provides better thermal coupling.

The assembly drawing of FIG. 5 shows details of the present invention which provides an improved thermal path from the circuit board 110 and vias 160 to the heat pipe 120. Generally, this thermal path is improved using thermal epoxy and physical pressure to assure that intimate physical contact is established between the aluminum block 130, the elastomer spacer 200, and the circuit board 110. The physical pressure is achieved using a mounting mechanism discussed below.

A mounting member such as a mounting plate 500 is affixed to aluminum block 130 or may form an integral part of aluminum block 130. Mounting pins 510 protrude from diagonally opposed corners on a surface of the mounting plate 500. Mounting pins 510 may be plastic pins which are removably inserted in apertures in the mounting plate 500. Mounting pins 510 cooperatively engage mounting apertures 520 holding aluminum block 130 in place. The block is secured by using pin inserts 550 to lock mounting pins 510 in mounting apertures 520. A heat conductive epoxy 530 or other heat conductive gel or glue may hold aluminum block 130 in intimate contact with spacer 200. Similarly, thermal epoxy 540 secures heat pipe 120 to aluminum block 130. It will be appreciated by one skilled in the art that different arrangements with respect to the pins, mounting apertures, and thermal epoxy may be used.

Aluminum block 130 has sufficient thermal inertia to moderate temperature changes of microprocessor 100. This can reduce the risk of exceeding a recommended operating temperature of microprocessor 100 during brief periods of elevated heat generation. The effect of a sudden burst of heat from microprocessor 100 is diminshed as some of the heat is effectively accumulated in the aluminum block 130. The heat accumulated by the aluminum block 130 is subsequently released through heat pipe 120.

Heat pipe 120 used in the present invention may be any of a variety of commercially available heat pipes. It is desirable to use a bend-once type heat pipe or a heat pipe which is rigidly formed with a bend. This allows two heat pipes, shown in FIG. 3, to spread heat across a larger area of metal plate 170. Suitable heat pipes are available from THERMACORE Inc. of Lancaster, Pa. Different geometrical arrangements of the various components involved which may allow the use of straight rigid heat pipes are within the scope and contemplation of this invention.

The heat pipe 120 is constructed to transfer heat from the aluminum block 130 to the metal plate 170. The heat pipe 120 typically contains a fluid that flows along a wick (not shown) attached to the inner surface of the pipe. Heat is applied to an evaporation section of the pipe 120 that is adjacent to the aluminum block 130 and removed from a condensation portion of the pipe 120 that is coupled to the metal plate 170. The heat vaporizes the fluid which creates a pressure differential between the evaporation section and the condensation section of the pipe 120. The pressure differential pumps the fluid through the wick from the condensation portion to the evaporation portion. The vaporized fluid is then pumped from the evaporation portion back to the condensation portion. The evaporation and condensation portions of heat pipes are generally defined by the direction of heat transfer since most heat pipes allow heat flow in multiple directions.

The evaporation portion near one end of each heat pipe 120 is thermally coupled to the recessed channel in aluminum block 130 using a thermal epoxy. Each heat pipe 120 bends approximately ninety degrees and follows metal plate 170. The condensation portion of each heat pipe 120 is the portion which runs beneath metal plate 170 and is thermally coupled to metal plate 170. A thermal epoxy 303 may be used to couple each heat pipe 120 and the metal plate 170.

The heat dissipation of metal plate 170 causes an elevated temperature at keyboard 140. One embodiment of the present invention using a straight THERMACORE heat pipe measuring 0.35"×0.1"×6" has an electronic component mounted beneath the keyboard 140. With a component temperature of 97° C., power consumption of 6.5 watts, and an ambient temperature of 35° C., the temperature at the keyboard 140 was 57° C. To moderate temperature changes at keyboard 140, an aluminum or a copper plate with greater mass may be used. Additionally, increasing ventilation openings in the vicinity of keyboard 140 and metal plate 170 will help improve heat dissipation.

The present invention may be assembled efficiently by completing two separate assemblies and coupling them together. The method of assembly is suited to the mounting of the embodiment of FIG. 5 in the computer 190 of FIG. 1. Provided a circuit board, the vias 160 are formed by drilling, punching, or other suitable means. The mounting apertures 520 are also formed at this stage. Solder is applied to the appropriate region and at least partially fills vias 160. A thermally conductive die attach is applied to improve thermal contact, and microprocessor 100 is soldered to circuit board 110. An elastomer spacer 200 is coupled to the circuit board 110 using an epoxy. The circuit board 110 is inserted into the computer 190.

The second assembly is separately formed. A first section of heat pipe 120 is affixed to the metal plate 170 using a thermally conductive epoxy or other suitable gluing agent. A second section of heat pipe 120 is then affixed to aluminum block 130 using an similar gluing agent 540. The mounting plate 500 with mounting pins 510 has been previously affixed to aluminum block 130 by an epoxy.

The first and second assemblies are coupled together by cooperatively engaging mounting pins 510 and mounting apertures 520. Detachment of aluminum block 130 from elastomer spacer 200 may be necessary if partial disassembly of computer 190 is required for repair or other reasons. The use of epoxy 530 generally reduces the ease of this detachment; however, the epoxy 530 improves thermal coupling between aluminum block 130 and elastomer spacer 200. The connection of the first and second assemblies is thus completed in one of the final steps of assembling computer 190.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus for removing heat from an electrical component, said component being mounted on a first surface of a circuit board, comprising:

a thermal via through said circuit board thermally coupled to said electrical component, said thermal via extending from said first surface to a second surface of said circuit board;

a heat conducting mass coupled to said second surface of said circuit board and thermally engaging said via;

a heat pipe thermally coupled to said heat conducting mass; and a heat dissipation plate thermally coupled to said heat pipe, said heat dissipation plate affixed beneath and substantially parallel to a keyboard.

2. The apparatus of claim 1 wherein said heat dissipation plate is an electromagnetic shield.

3. The apparatus of claim 1 wherein said via comprises:

a portion of said circuit board defining an aperture; and a filler with a higher thermal conductivity than said circuit board, said filler disposed within said aperture.

4. The apparatus of claim 3 wherein said filler is selected from the group consisting of copper and solder.

5. The apparatus of claim 3 further comprising:

a thermally conductive compressively conforming spacer interposed between said heat conducting mass and said circuit board.

6. The apparatus of claim 5 further comprising a mounting member attached to said heat conducting mass, said mounting member including a pin, said circuit board including a mounting aperture, and said heat conducting mass being removably attached to said circuit board cooperatively engaging said pin and said mounting aperture.

7. The apparatus of claim 5 further comprising a mounting member attached to said heat conducting mass, said mounting member being rectangular and including two pins diagonally opposed protruding from a surface of said mounting member, said circuit board including two mounting apertures, and said heat conducting mass being attached to said circuit board cooperatively engaging said two pins and said mounting apertures.

8. An apparatus for removing heat from an integrated circuit mounted on a first surface of a circuit board, comprising:

a region of said circuit board defining a plurality of apertures thermally coupled to said integrated circuit, said plurality of apertures extending from said first surface to a second surface of said circuit board, said region at least partially filled by material with a higher thermal conductivity than said circuit board;

a heat conducting mass coupled to said second surface of said circuit board and thermally engaging said plurality of apertures;

a heat pipe thermally coupled to said heat conducting mass; and a heat dissipation plate affixed substantially beneath and parallel to a keyboard, said heat dissipation plate thermally coupled to said heat pipe.

9. An apparatus for removing heat from an electrical component in a computer, said computer including a keyboard having a metal electromagnetic shield, a circuit board, and said component mounted on a first surface of said circuit board, the apparatus comprising:

a region of said circuit board defining a plurality of apertures thermally coupled to said electrical component, said plurality of apertures extending from said first surface to a second surface of said circuit board, said region at least partially filled by material with a higher thermal conductivity than said circuit board;

a heat conducting mass coupled to said second surface of said circuit board and thermally engaging said plurality of apertures;

a heat pipe thermally coupled to said heat conducting mass and coupled to the electromagnetic shield of the keyboard.

10. The apparatus of claim 9 wherein said electrical component is an integrated circuit chip.

11. The apparatus of claim 10 wherein said heat dissipation plate is a metal electromagnetic shield.

12. The apparatus of claim 11 further comprising a mounting member attached to said heat conducting mass, said mounting member being rectangular and including two pins diagonally opposed protruding from a surface of said mounting member, said circuit board including two mounting apertures, and said heat conducting mass being attached to said circuit board cooperatively engaging said two pins and said mounting apertures.

13. A method of cooling an integrated circuit in a computer including a keyboard, comprising the steps of:

(A) forming a first assembly by
  (1) providing a circuit board;
  (2) forming a first set and a second set of apertures in said circuit board, said first set of apertures disposed within a region;
  (3) applying a thermally conductive material to said region partially filling said first set of apertures;
  (4) attaching said integrated circuit to said circuit board;

(B) forming a second assembly by
  (1) connecting a heat pipe to a metal electromagnetic interference shield;
  (2) affixing said heat pipe to a heat conducting block; and (C) coupling said first assembly to said second assembly by coupling said heat conducting block to said circuit board thermally engaging said heat conducting block and said first set of apertures; and (D) affixing the metal electromagnetic shield beneath and substantially parallel to a keyboard.

14. The method of claim 13 prior to the step of coupling (C) further comprising covering said first set of apertures with an elastomer spacer.

15. The method of claim 14 wherein the attaching step (A)(4) further comprises:

(a) applying a die attach between said circuit board and said integrated circuit; and (b) soldering said integrated circuit to said circuit board.

16. The method of claim 15 wherein said connecting step (B)(1) further comprises using a thermally conductive epoxy to connect said heat pipe to said metal electromagnetic interference shield.

17. The method of claim 16 wherein said affixing step (B)(2) further comprises using a thermally conductive epoxy to connect said heat pipe to said heat conducting block.

18. The method of claims 14 or 17 wherein said heat conducting block is attached to a rectangular mounting block including two mounting pins diagonally opposed protruding from said mounting block, said second set of apertures includes two mounting apertures, and said coupling step (C) further comprises:

(1) thermally attaching said mounting block to said elastomer spacer; and (2) cooperatively engaging said two mounting pins to said two mounting apertures.

19. A method of cooling an integrated circuit mounted on a first surface of a circuit board in a computer including a keyboard, comprising the steps of:

(a) transferring heat from said integrated circuit mounted on said first surface of said circuit board through a plurality of thermal vias to a second surface of said circuit board;

(b) transferring said heat from said plurality of thermal vias to a mass;

(c) transferring heat from said mass to a plate affixed substantially beneath and parallel to said keyboard; and (d) dissipating said heat from said plate beneath said keyboard.

* * * * *